US011268689B2

(12) United States Patent
Chen et al.

(10) Patent No.: US 11,268,689 B2
(45) Date of Patent: Mar. 8, 2022

(54) ILLUMINABLE ICON WITH A LIGHT GUIDE FILM AND AN ISOLATION BLOCK

(71) Applicant: Dell Products L.P., Round Rock, TX (US)

(72) Inventors: Yi-Chang Chen, New Taipei (TW); Chih-Hsien Chang, Taipei (TW); Hsiang-Yin Hung, Taipei (TW)

(73) Assignee: Dell Products L.P., Round Rock, TX (US)

( * ) Notice: Subject to any disclaimer, the term of this patent is extended or adjusted under 35 U.S.C. 154(b) by 50 days.

(21) Appl. No.: 16/243,603

(22) Filed: Jan. 9, 2019

(65) Prior Publication Data

US 2020/0217497 A1    Jul. 9, 2020

(51) Int. Cl.

| | | |
|---|---|---|
| *F21V 33/00* | (2006.01) | |
| *F21V 3/10* | (2018.01) | |
| *G06F 1/18* | (2006.01) | |
| *H05K 3/30* | (2006.01) | |
| *F21Y 113/13* | (2016.01) | |
| *H05K 1/18* | (2006.01) | |
| *F21Y 115/10* | (2016.01) | |

(52) U.S. Cl.
CPC ............ *F21V 33/0052* (2013.01); *F21V 3/10* (2018.02); *G06F 1/182* (2013.01); *F21Y 2113/13* (2016.08); *F21Y 2115/10* (2016.08); *H05K 1/181* (2013.01); *H05K 3/303* (2013.01); *H05K 2201/10106* (2013.01)

(58) Field of Classification Search
CPC ........ G06F 1/182; F21V 33/0052; F21V 3/10; G09F 13/04; H05K 1/0274

USPC ....................................................... 362/23.08
See application file for complete search history.

(56) References Cited

U.S. PATENT DOCUMENTS

| | | | | |
|---|---|---|---|---|
| 6,691,443 B1 * | 2/2004 | Slayden | ............... | G02B 6/0038 362/604 |
| 8,847,897 B2 * | 9/2014 | Sakai | ..................... | H01H 13/83 200/19.14 |
| 2017/0043709 A1 * | 2/2017 | Dellock | ................ | F21V 23/003 |
| 2017/0072800 A1 * | 3/2017 | Fujita | ....................... | G01D 7/06 |

* cited by examiner

*Primary Examiner* — Karabi Guharay
(74) *Attorney, Agent, or Firm* — Norton Rose Fulbright US LLP

(57) ABSTRACT

An information handling system may include one or more illuminable icons to present information to a user of the system, such as information regarding a status of the information handling system. An illuminable icon may be lit by a plurality of light sources, and light from the plurality of light sources may be diffused across the illuminable icon by a light guide film. Some illuminable icons may have multiple portions that may be separately illuminated to convey different information to a user. An isolation block may prevent light from light sources configured to illuminate one portion of an illuminable icon from illuminating other portions of the illuminable icon. Thus, light for illuminating icons of an information handling system may be diffused and/or blocked to enhance aesthetic appeal of the icons and to prevent user confusion that may result from bleeding of light from one portion of an illuminable icon to another and/or uneven illumination of an icon.

18 Claims, 15 Drawing Sheets

ILLUMINABLE ICON WITH A LIGHT GUIDE FILM AND AN ISOLATION BLOCK

FIELD OF THE DISCLOSURE

The instant disclosure relates to information handling system light sources. More specifically, portions of this disclosure relate to illuminable icons of information handling systems.

BACKGROUND

As the value and use of information increase, individuals and businesses seek additional ways to process and store information. One option available for such a purpose is the information handling system. An information handling system generally processes, compiles, stores, and/or communicates information or data for business, personal, or other purposes thereby allowing users to take advantage of the value of the information. Because technology and information handling requirements vary between different users or applications, information handling systems may also vary regarding what information is handled, how the information is handled, how much information is processed, stored, or communicated, and how quickly and efficiently the information may be processed, stored, or communicated. Variations in information handling system build and capabilities allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may include a variety of components that convey information to users. For example, some information handling systems may include displays, such as liquid crystal displays (LCDs), light emitting diode (LED) displays, organic light emitting diode (OLED) displays, and other displays for displaying information. Alternatively or additionally, information handling systems may include indicator light sources, such as indicator LEDs, that may indicate a status of an information handling system. Some information handling systems may include faceplates or other components with portions that are at least partially transparent to allow light from light sources to pass through the faceplate or component, illuminating an icon, such as a symbol, word, or other image, to provide a user with information as to a status of the information handling system.

Light from light sources may bleed over from an icon that a light source is intended to illuminate to another icon that the light source is not intended to illuminate, inadvertently illuminating an icon. Inadvertent illumination of icons may confuse a user, indicating a condition of the information handling system that the system is not actually experiencing. Light from light sources may be unevenly distributed across an icon, with some portions of the icon being less bright, or even completely unlit. Uneven distribution of light across an illuminated icon may reduce the aesthetic appeal of an icon and, in some cases, may confuse a user as to whether the icon is intended to be illuminated or unilluminated.

Shortcomings mentioned here are only representative and are included simply to highlight that a need exists for improved information handling systems. Embodiments described herein address certain shortcomings but not necessarily each and every one described here or known in the art. Furthermore, embodiments described herein may present other benefits than, and be used in other applications than, those of the shortcomings described above.

SUMMARY

An information handling system may include one or more illuminable icons to present information to a user of the system, such as information regarding a status of the information handling system. An illuminable icon may be lit by a plurality of light sources, and light from the plurality of light sources may be diffused across the illuminable icon by a light guide film. Some illuminable icons may have multiple portions that may be separately illuminated to convey different information to a user. An isolation block may prevent light from light sources configured to illuminate one portion of an illuminable icon from illuminating other portions of the illuminable icon. Thus, light for illuminating icons of an information handling system may be diffused and/or blocked to enhance aesthetic appeal of the icons and to prevent user confusion that may result from bleeding of light from one portion of an illuminable icon to another and/or uneven illumination of an icon.

An apparatus, such as an information handling system may include illuminable icons to convey information about a system, such as information about a status of a system, to a user. An illuminable icon may be illuminated by one or more light sources configured to illuminate the icon. A light guide film may be configured to diffuse light from one or more light sources across an illuminable icon.

Diffusing light from a plurality of light sources across an illuminable icon using the light guide film may make the icon more aesthetically pleasing to the user and may reduce user confusion. For example, using a light pipe or other means of channeling light from a light source to the illuminable icon may result in bright spots and dark spots of the icon. In some cases, dim portions of an icon may confuse a user and may make it unclear whether the icon is illuminated to indicate a status of the system. For example, if an icon indicating one or more notifications are available is unevenly lit, it may not catch a user's attention, or, if it does, it may not be clear to a user whether the icon is lit to indicate the presence of errors or is experiencing light bleed from other icons or another error in lighting. By diffusing light more evenly across the icon, a user experience may be enhanced through presentation of a more aesthetically pleasing icon and reduced confusion resulting from unevenly lit icons.

The illuminable icon may, for example, include a portion of a faceplate or other information handling system component that is at least partially transparent to allow light to pass through the illuminable icon. The portion of the faceplate may, for example, be colored to change a hue of light passing through the portion. In some embodiments, the portion of the faceplate may be partially opaque to dim and/or diffuse light passing through the portion.

Light sources may be positioned behind the illuminable icon to allow light to pass from the light sources outwards through the illuminable icon to a user. Light sources of multiple colors may be included to illuminate the illuminable icon. For example, light sources for illuminating the illuminable icon may include a plurality of light sources of a first color, such as blue, and a plurality of light sources of a second color, such as amber. The plurality of light sources of the first color may be configured to illuminate the illuminable icon in the first color to indicate a first condition of an information handling system, such as to indicate that the information handling system is in good operating condition. The plurality of light sources of the second color may be configured to illuminate the illuminable icon in the second color to indicate a second condition of the information handling system, such as to indicate that the information handling system has encountered an error and/or is inoperable. The light sources may include one or more light emitting diodes (LEDs). The LEDs may, for example be located on a printed circuit board (PCB) located behind the illuminable icon.

The light guide film may be located behind the illuminable icon and may cover a rear surface of the illuminable icon. The light guide film may be co-planar with a plurality of light sources, such as light emitting diodes, for illuminating the illuminable icon. For example, each of a plurality of light emitting diodes may be located at an outer edge of the light guide film and the light guide film may diffuse light from the light emitting diodes across the illuminable icon.

Some illuminable icons may include multiple portions that are lit in different colors and/or at different times to convey different information to a user. Different light sources or sets of light sources may be configured to illuminate different portions of an illuminable icon. For example, an illuminable icon may include a first portion and a second portion. Separate light sources and/or sets of light sources may be configured to light the first portion of the illuminable icon and the second portion of the illuminable icon. In order to prevent light from one or more light sources configured to illuminate the first portion of the illuminable icon from bleeding into the second portion of the illuminable icon, and vice versa, the apparatus may include an isolation block configured to prevent light from one or more light sources configured to illuminate the first portion from illuminating the second portion. The isolation block may be further configured to prevent light from one or more light sources configured to illuminate the second portion from illuminating the first portion. An isolation film may also be included to further prevent light from bleeding from light sources. For example, the isolation film may form a seal between the isolation block and a PCB upon which one or more light sources are mounted to prevent light from passing between the isolation block and the PCB.

One or more isolated light sources may be included within the isolation block to illuminate a portion of the illuminable icon located within the isolation block. For example, the second portion of the illuminable icon may be located within the perimeter of the isolation block and an isolated light source may be located within or below the isolation block to illuminate the second portion of the illuminable icon. The isolated light source may be configured to illuminate the second portion of the illuminable icon separately from the first portion of the illuminable icon. For example, the first portion of the illuminable icon may be a symbol, such as a ring, that is illuminated to indicate to a user a status of the information handling system, such as whether the information handling system is operational or non-operational. For example, the first portion of the illuminable icon may illuminate in a first color, such as blue, when the information handling system is operational and may illuminate in a second color, such as amber, when the information handling system is non-operational. The second portion of the illuminable icon may be an alert icon that is illuminated to indicate to a user that one or more messages or notifications ready to be viewed on the information handling system or that the system has encountered one or more errors. The second portion of the illuminable icon may be configured to illuminate in the second color, such as amber. Thus, an illuminable icon may include multiple portions that may be separately illuminated to present information to a user, such as information about a status of the system.

Isolation of separately illuminable portions of an illuminable icon may prevent light from an illuminated icon or portion of an icon from bleeding into other icons and/or other portions of the icon. When light from light sources configured to illuminate a first illuminable icon or a first portion of an illuminable icon bleeds into a second illuminable icon or a second portion of the illuminable icon, it may confuse a user, indicating a false status of the information handling system. For example, if light illuminating a second portion of an illuminable icon, indicating to a user that an information handling system is operational, bleeds into a second portion of the illuminable icon, indicating that one or more notifications are available, a user may be led to believe that one or more notifications are available, when, in fact, no notifications are available. Thus, preventing light for illuminating a first illuminable icon or a first portion of an illuminable icon from illuminating other illuminable icons and/or portions of illuminable icons may reduce user confusion and enhance a user experience.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, a two-in-one laptop/tablet computer, mobile device (e.g., personal digital assistant (PDA), smart phone, tablet computer, or smart watch), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more virtual or physical buses operable to transmit communications between the various hardware and/or software components.

Figure 1:
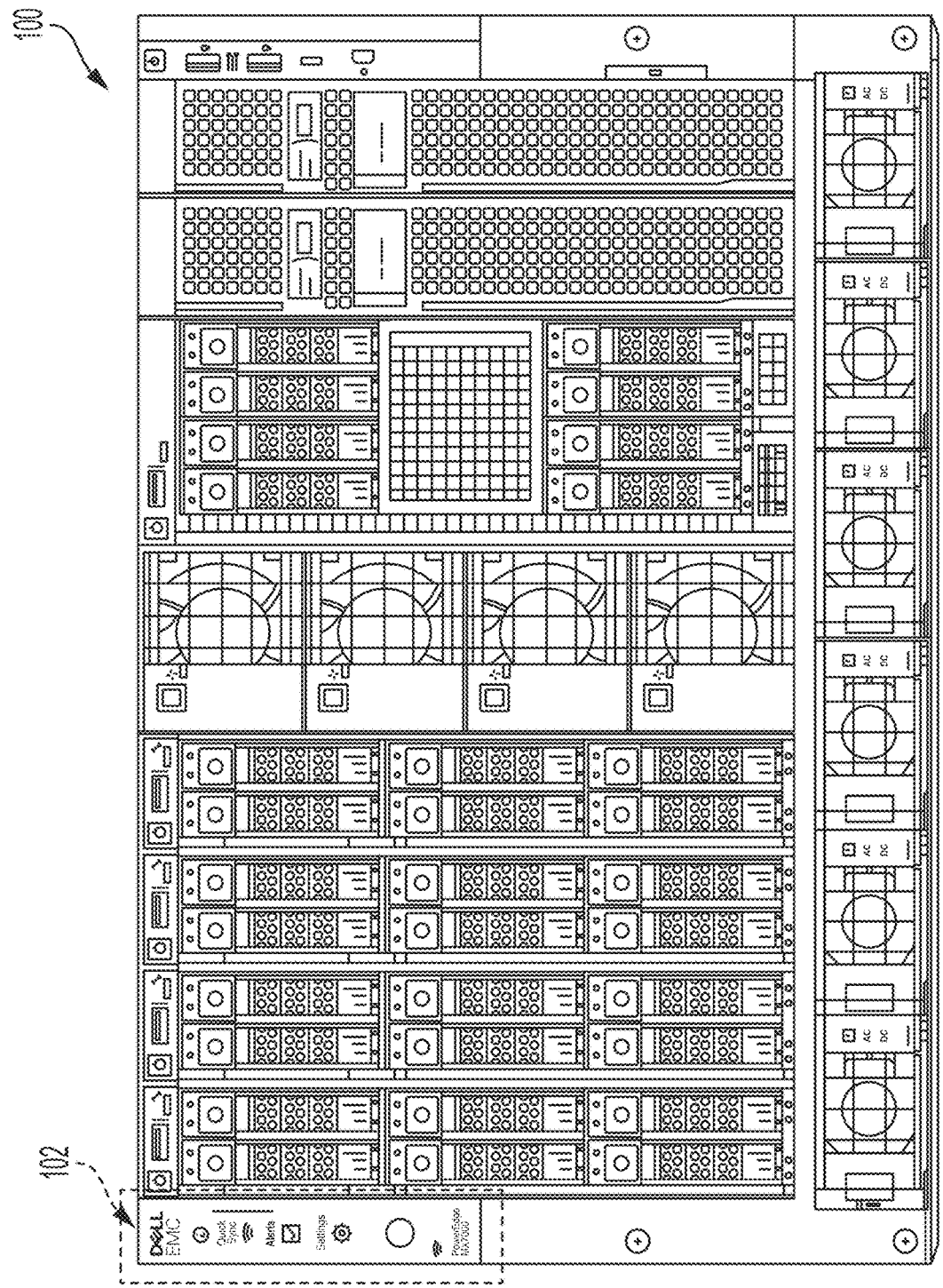
FIG. 1 is an illustration of an information handling system having illuminable icons according to some embodiments of the disclosure.

Information handling systems may include a variety of indicators to convey information to a user. For example, many information handling systems include illuminable icons that convey information to a user about a status of the system. Information handling system 100, shown in FIG. 1, includes multiple illuminable icons. For example, faceplate 102 of information handling system 100 includes two illuminable icons and an LCD for presenting information to a user. The illuminable icons and LCD of the faceplate 102 may convey information to a user about the status of the information handling system 100 and/or components of the information handling system 100.

The information handling system 100 may, for example, be a rack-mountable chassis and may be modular in nature for supporting multiple processing nodes. Illuminable icons of the information handling system 100 may communicate information to a user as to the health of the system 100 as well as components, such as processing nodes, installed in the information handling system 100. For example, a faceplate 102 having one or more illuminable icons may be located on a left rack ear panel of the information handling system 100.

An example information handling system faceplate 200 is shown in FIG. 2. The faceplate 200 may include a touch sensitive portion 202 for receiving touch input from a user. The faceplate 200 may further include an LCD 204 for accepting input from and displaying information to a user. The faceplate 200 may include a first illuminable icon 210, such as a manufacturer logo. The first icon 210 may, for example, be a transparent or semi-transparent portion of the faceplate to allow one or more light sources located behind the illuminable icon 210 to illuminate the icon 210 when the information handling system is powered on.

The faceplate 200 may also include a second illuminable icon 212 for displaying information to a user about a status of the system. The second illuminable icon 212 may also be transparent or semi-transparent to allow one or more light sources located behind the illuminable icon 212 to illuminate the icon 212 or portions of the icon 212 when the information handling system is powered on. The second illuminable icon 212 may include a first portion 206 and a second portion 208. The first portion 206 may, for example, be a ring illuminated to indicate the status of the system and/or a status of one or more system components. For example, when the system is online and is operating without any errors, the first portion 206 may be illuminated in a first color, such as blue. In some embodiments, the first portion may blink at a predetermined interval. When the system is not operational and/or has encountered an error, the first portion 206 may be illuminated in a second color, such as amber. The second portion 208 of the second illuminable icon 212 may be separately illuminable from the first portion 206. The second portion 208 may be illuminated to indicate that one or more status updates or messages are available to be viewed by a user of the information handling system. Alternatively or additionally, the second portion 208 may be illuminated to indicate that a fault has occurred in the system in general or in one or more components of the system. For example, the second portion 208 may be illuminable in an array of colors or in only the second color, such as amber. Thus, in a scenario where the system is online and has not encountered any errors but has one or more status updates or messages that are available to be viewed by a user, the first portion 206 may be illuminated in a first color, such as blue, while the second portion 208 may be illuminated in a second color, such as amber. In order to prevent light from one or more light sources configured to illuminate the first portion 206 from illuminating the second portion 208, and vice versa, an isolation block may be included. Furthermore, a light guide film may be included to evenly distribute light across the first portion 206 and the second portion 208.

Figure 2A:
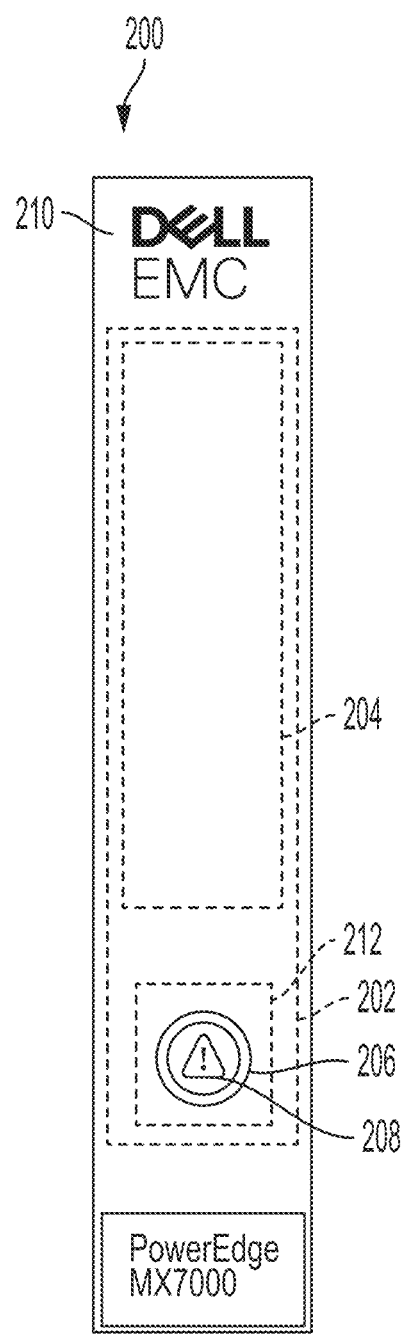
FIG. 2A is an illustration of a faceplate panel of an information handling system having an illuminated icon according to some embodiments of the disclosure.
Figure 2B:
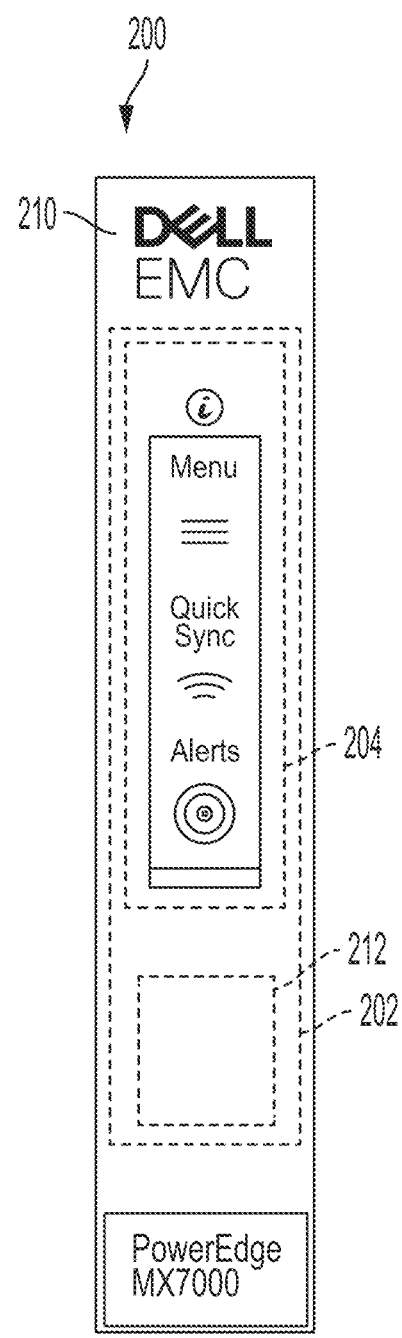
FIG. 2B is an illustration of a faceplate panel of an information handling system having an icon that is not illuminated according to some embodiments of the disclosure.

When the display 204 is activated, the second illuminable icon 212 may be unlit, as shown in FIG. 2B. For example, when the display 204 of the faceplate 200 is activated as shown in FIG. 2B it may provide options for user interaction such as a quick sync option, an alerts option, and a menu option. The user may interact with the information displayed on the display 204 by touching portions of the touch panel 202. The first illuminable icon 210 may remain illuminated whether the display 204 is activated or not. In some embodiments, the second illuminable icon 212 may turn off when the display 204 is activated and may turn on when the display 204 is deactivated.

Figure 3A:
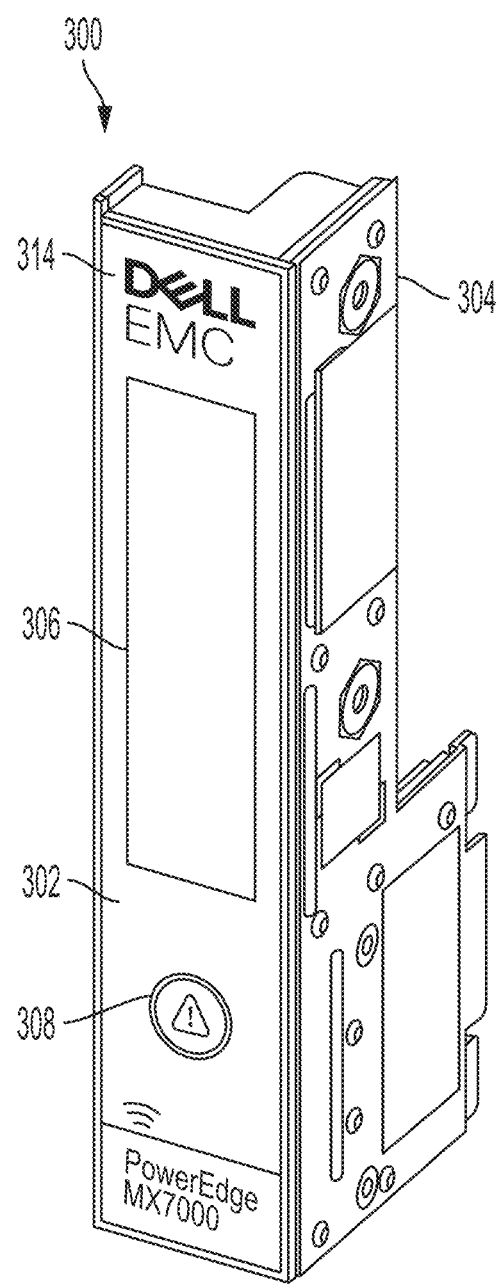
FIG. 3A is an isometric view of a faceplate of an information handling system having an illuminable icon according to some embodiments of the disclosure.
Figure 3B:
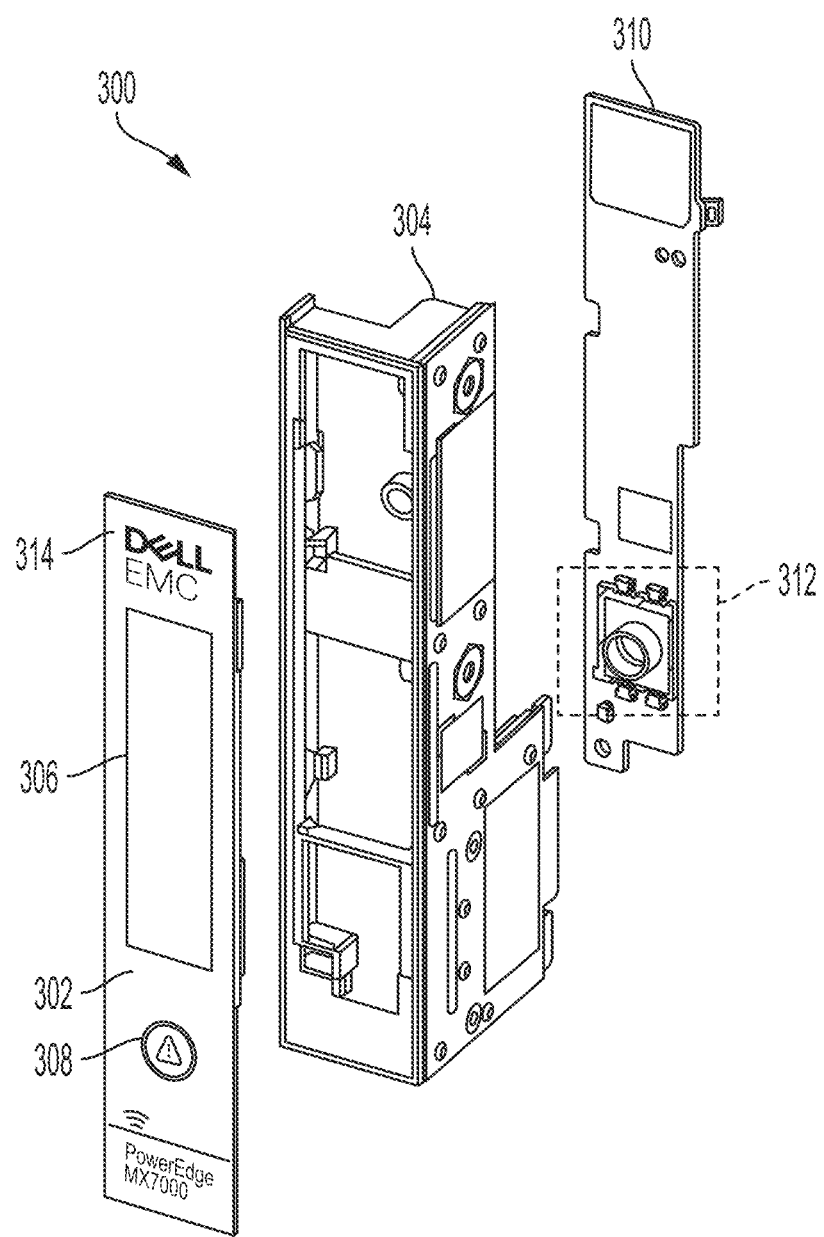
FIG. 3B is an expanded isometric view of a faceplate of an information handling system having an illuminable icon according to some embodiments of the disclosure.

FIG. 3A is an isometric view of a faceplate 300 of an information handling system. The faceplate 300 may, for example, include a front panel 302 including a display 306, such as an LCD, a first illuminable icon 314, such as a manufacturer logo, and a second illuminable icon 308. The second illuminable icon 308 may be illuminated to convey information about a status of the system to a user. The faceplate 300 may also include a control panel housing 304 for housing circuitry for controlling the display 306. FIG. 3B is an expanded view of the front panel 302, the control panel housing 304, and a printed circuit board (PCB) 310. The PCB 310 may be supported by the control panel housing 304 and may include circuitry and components for controlling the display 306 and illuminating the first illuminable icon 314 and the second illuminable icon 312. For example, the PCB 310 may include a lighting circuit 312 for illuminating and controlling illumination of the second illuminable icon 308.

Figure 4A:
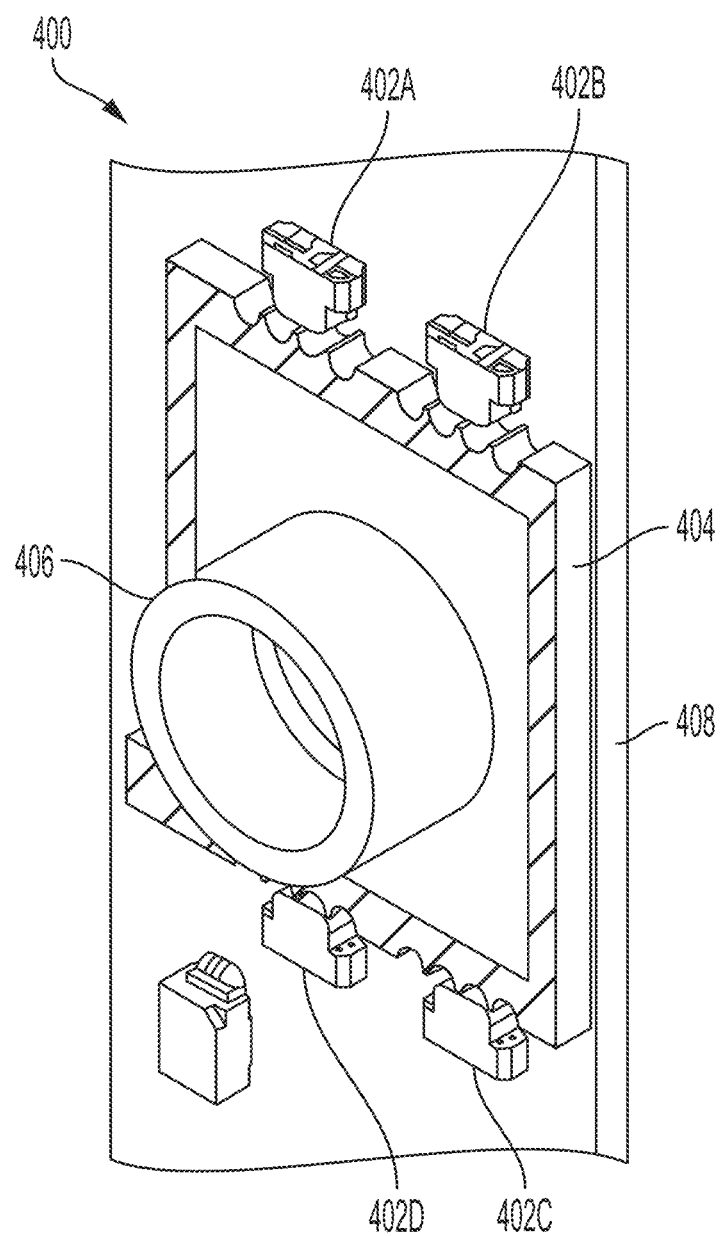
FIG. 4A is an isometric view of a lighting circuit for an illuminable icon according to some embodiments of the disclosure.

A lighting circuit for illuminating an illuminable icon may include multiple light sources of multiple colors for illuminating the icon. A lighting circuit 400, as shown in FIG. 4A, may be located on a PCB 408. For example, a plurality of light sources, such as LEDs 402A-D, may be positioned to illuminate a first portion of an illuminable icon, such as first portion 206 of illuminable icon 212 shown in FIG. 2A. The plurality of light sources 402A-D may, for example, be LEDs, and may illuminate in multiple colors, such as blue and amber. The plurality of light sources 402A-D may be distributed about a light guide film 404. The light guide film 404 may diffuse the light across an illuminable icon or a portion of an illuminable icon. For example, in some systems light pipes may be used to transmit light from a light source to a specific point, while a light guide film 404 may be used to diffuse light from multiple light sources across an area. The use of light pipes may lead to bright spots and dim spots on an illuminable icon, while a light guide film 404 may distribute light more uniformly across an illuminable icon. The light guide film 404 may also be easily customizable to fit a variety of form factors depending on a shape of an illuminable icon and space available for the light guide film and may take up less space than a light pipe or a plurality of light pipes. The light guide film 404 may include an adhesive to attach the light guide film 404 to the PCB 408. A first set of the plurality of light sources 402A-B may be located on a first side of the light guide film 404, while a second set of the plurality of light sources 402C-D may be located on a second side of the light guide film 404. Alternatively, any number of light sources may be arranged in any configuration about the outer and/or inner edge of the light guide film 404. In some embodiments, the light guide film 404 may include cut outs adjacent to each of the plurality of light sources 402A-D to increase surface area of the light guide film 404 exposed to light from the plurality of light sources 402A-D.

Figure 4B:
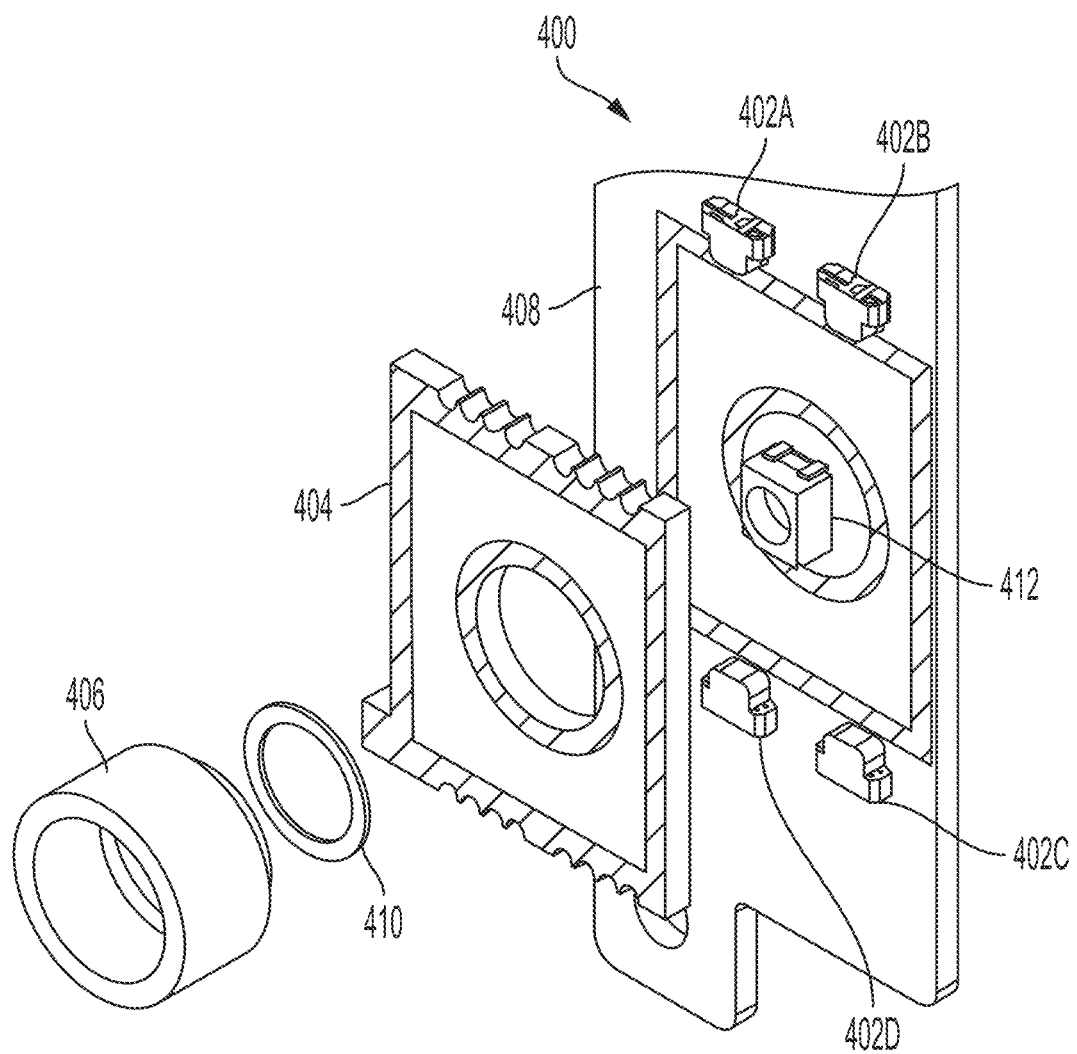
FIG. 4B is an expanded isometric view of a lighting circuit for an illuminable icon according to some embodiments of the disclosure.

The lighting circuit 400 may also include an isolation block 406 to prevent light from the plurality of light sources from illuminating a second portion of an illuminable icon, such as the second portion 208 of illuminable icon 212, shown in FIG. 2A. The isolation block 406 may, for example, be a cylindrical element made of plastic, metal, or another opaque substance. The isolation block 400 may include a cylindrical aperture in the center to allow light from an isolated light source 412 located inside or underneath the aperture to reach an illuminable icon. The isolated light source 412 may be configured to illuminate a second portion of an illuminable icon, such as the second portion 208 of the illuminable icon 212, shown in FIG. 2A. In some embodiments, the isolated light source 412 may be capable of emitting multiple colors of light, such as blue and amber, while in other embodiments the isolated light source 412 may emit only a single color of light, such as amber. The isolation block 406 may be further configured to prevent light from the isolated light source 412 from illuminating a first portion of an illuminable icon, such as the first portion 206 of illuminable icon 212 shown in FIG. 2A. The lighting circuit 400 may also include an isolation film 410, as shown in the expanded lighting circuit 400 of FIG. 4B, such as a compressible insulator, that is configured to form a seal between the isolation block 406 and the PCB 408, preventing light from passing between the isolation block 406 and the PCB 408. The isolation block 406 and the isolation film 410 may together form a masking mechanism to prevent light from light sources configured to illuminate a first portion of an illuminable icon from bleeding into a second portion of the illuminable icon and to prevent light from light sources configured to illuminate the second portion of the illuminable icon from bleeding into the first portion of the illuminable icon.

Figure 5:
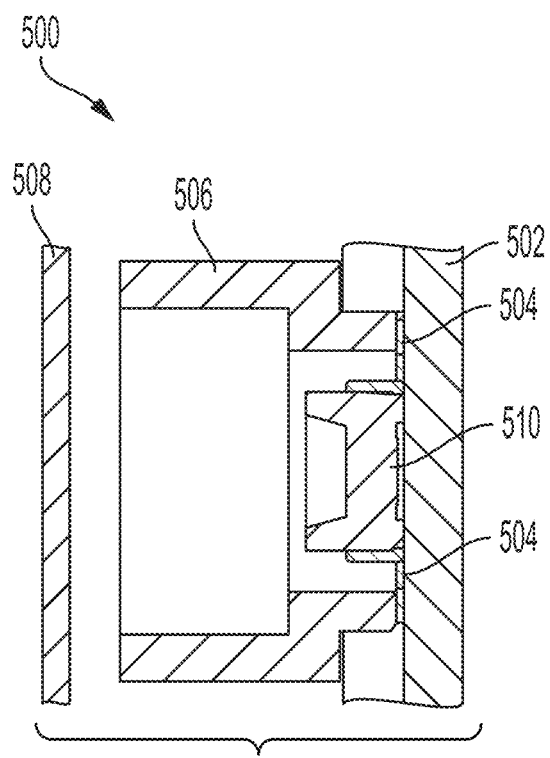
FIG. 5 is a side view of an isolation block of a lighting circuit for an illuminable icon according to some embodiments of the disclosure.

FIG. 5 shows an example side view of a portion of a lighting circuit 500. An isolation block 506 may be attached to a PCB 502. For example, the isolation block 506 may be attached to the PCB 502 via an isolation film 504. The isolation film 504 may form a seal between the isolation block 506 and the PCB 502 to prevent light from passing between the isolation block 506 and the PCB 502. The isolation block 506 may channel light from an isolated light source 510, such as an LED, to an illuminable icon or to a portion of an illuminable icon on a front panel 508 of a faceplate of an information handling system.

Figure 6:
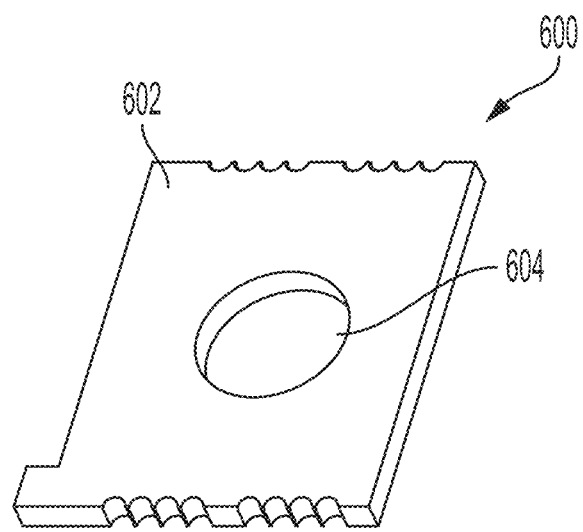
FIG. 6 is an isometric view of a light guide film according to some embodiments of the disclosure.

An example light guide film 600 is shown in FIG. 6. The light guide film 600 may, for example, include a surface 602 having an adhesive for attaching the light guide film 600 to a PCB. The light guide film 600 may also include a cutout 604 to allow an isolation block to attach to a PCB in the center of the light guide film, preventing light from the light guide film from illuminating an illuminable icon or a portion of an illuminable icon that is adjacent to an interior of the isolation block.

A plurality of lights of a lighting block may illuminate a first portion of an illuminate a first portion of an illuminable icon, while an isolation block may prevent the light from the plurality of lights from illuminating a second portion of the illuminable icon. An example lighting circuit 700 illuminating a first portion 708 of an illuminable icon is shown in FIG. 7. A plurality of light sources 704A-D may be located on a PCB 702 and may illuminate a first portion 708 of an illuminable icon. For example, light sources 704A-D may illuminate a light guide film 706 which may diffuse the light from the light sources 704A-D across the first portion 708 of the illuminable icon. An isolation block 710 may prevent light from the light sources 704A-D from illuminating the second portion of the illuminable icon 712. An isolated light source 714, such as an LED, may be located behind the second portion 712 of the illuminable icon, but may be deactivated, so that the second portion 712 of the illuminable icon is not illuminated. The plurality of light sources 704A-D may illuminate the first portion 708 of the illuminable icon in a variety of colors. For example, the plurality of light sources 704A-D may illuminate the first portion 708 with a first color, such as blue, when the information handling system is online, and may illuminate the first portion 708 in a second color, such as amber, when the information handling system is not operational, has encountered an error, or requires system maintenance.

Figure 7A:
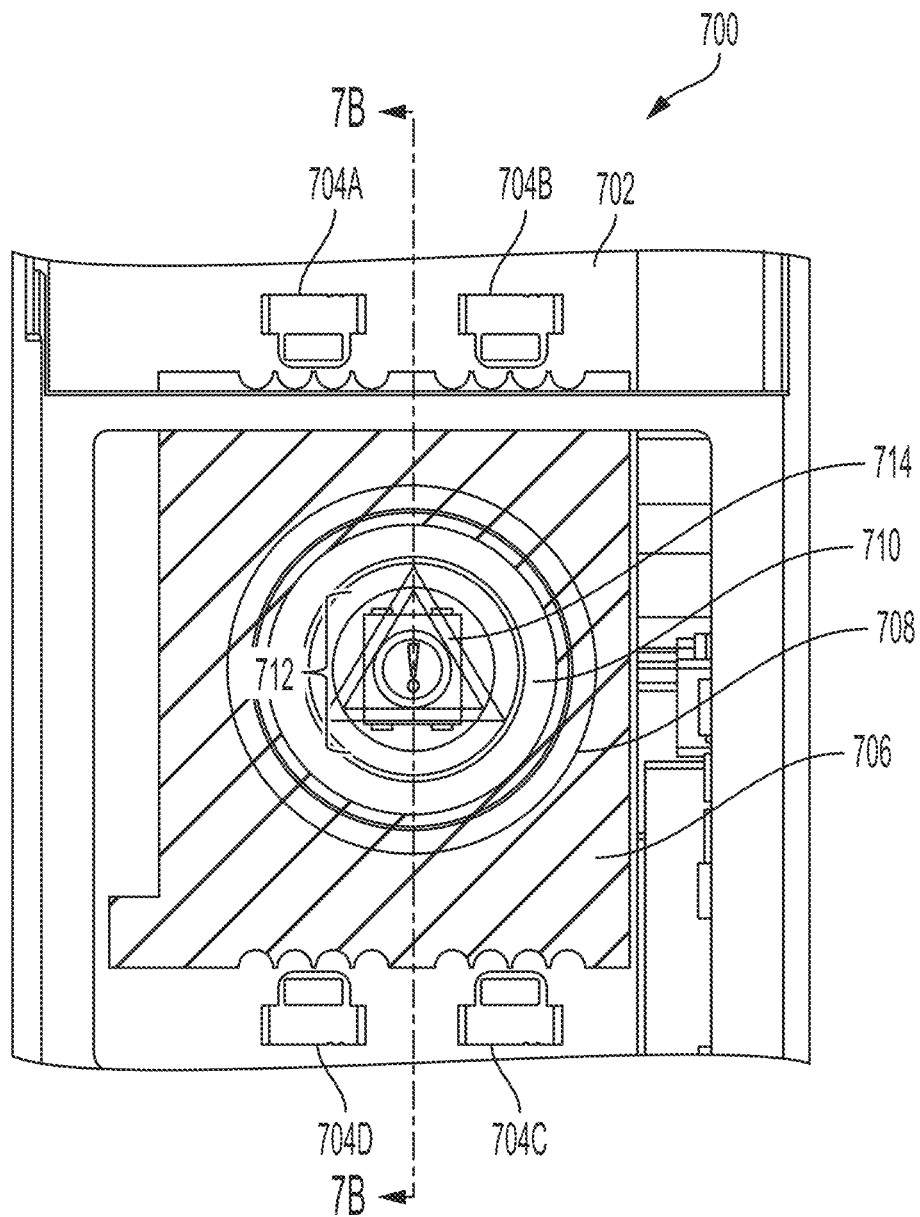
FIG. 7A is an illustration of a lighting circuit for an illuminable icon with an illuminated outer portion according to some embodiments of the disclosure.
Figure 7B:
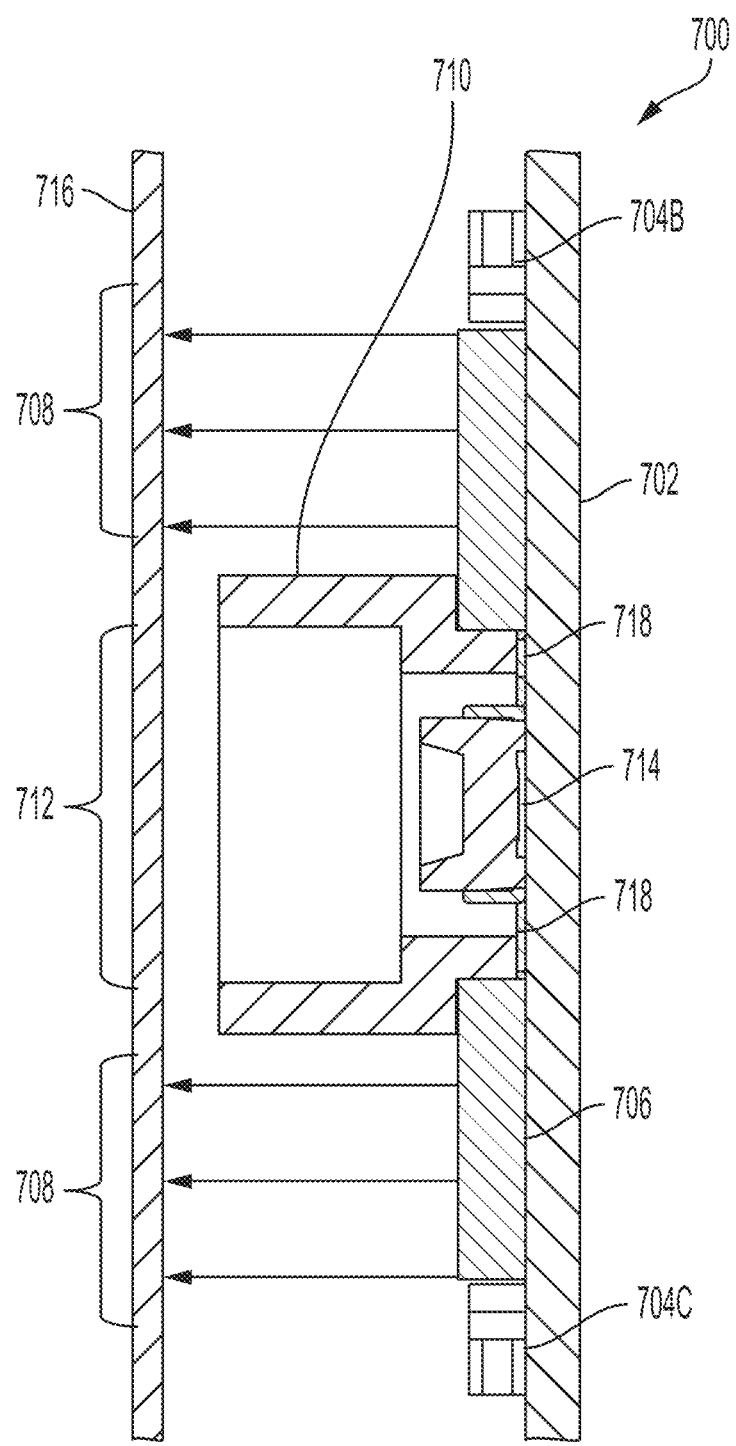
FIG. 7B is a side view of an example illuminable icon and lighting circuit for the illuminable icon with an illuminated outer portion according to some embodiments of the disclosure.

FIG. 7B is a side view of a front panel 716 and lighting circuit of an information handling system face plate. As shown in FIG. 7B light from the plurality of light sources 704A-D may be further blocked by an isolation film 718, forming a seal between the isolating block 710 and the PCB 702. As shown in FIG. 7B, light from the plurality of light sources 704A-D reaches the front panel 716, illuminating the first portion 708 of the illuminable icon while being blocked by the isolation block 710 from illuminating the second portion 712 of the illuminable icon.

Figure 7C:
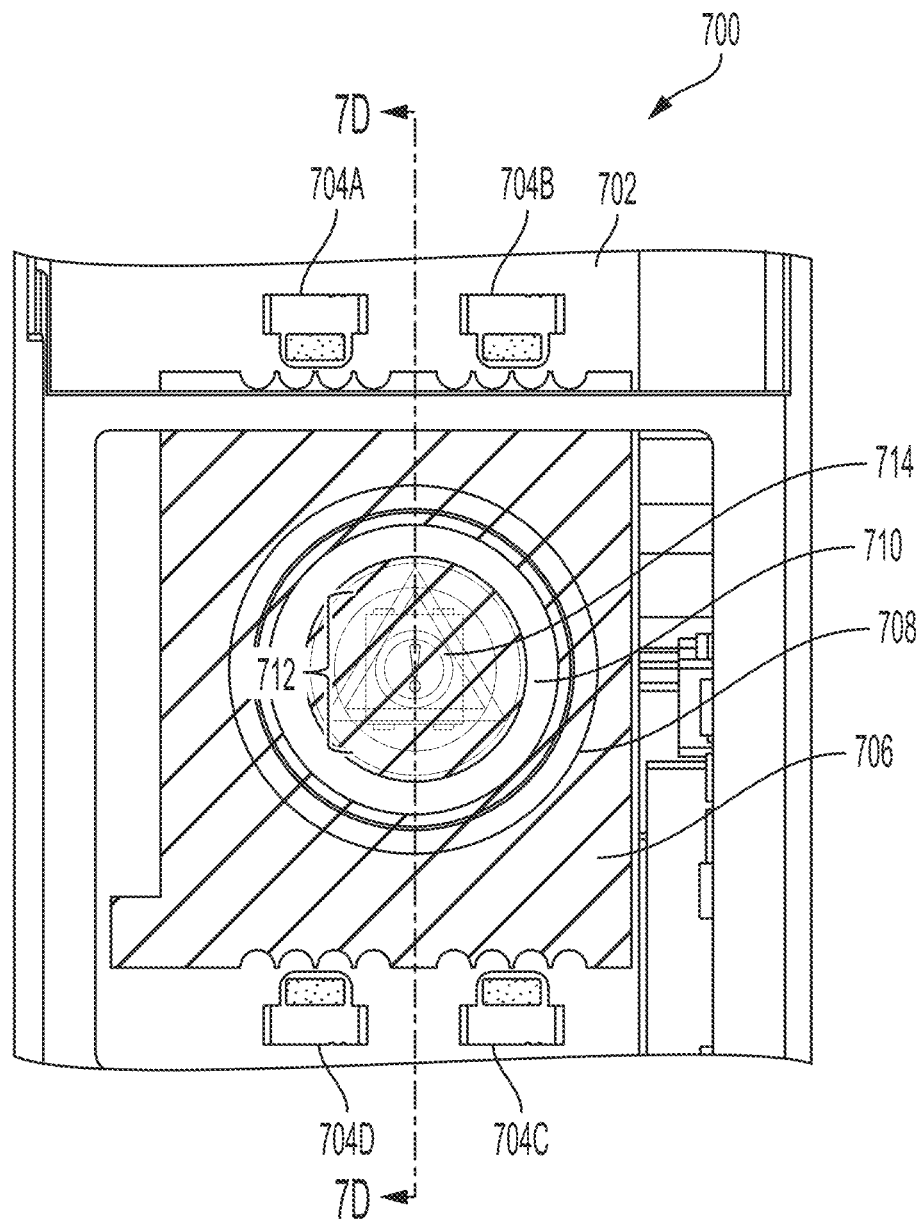
FIG. 7C is an illustration of a lighting circuit for an illuminable icon with an illuminated outer portion and an illuminated inner portion according to some embodiments of the disclosure.
Figure 7D:
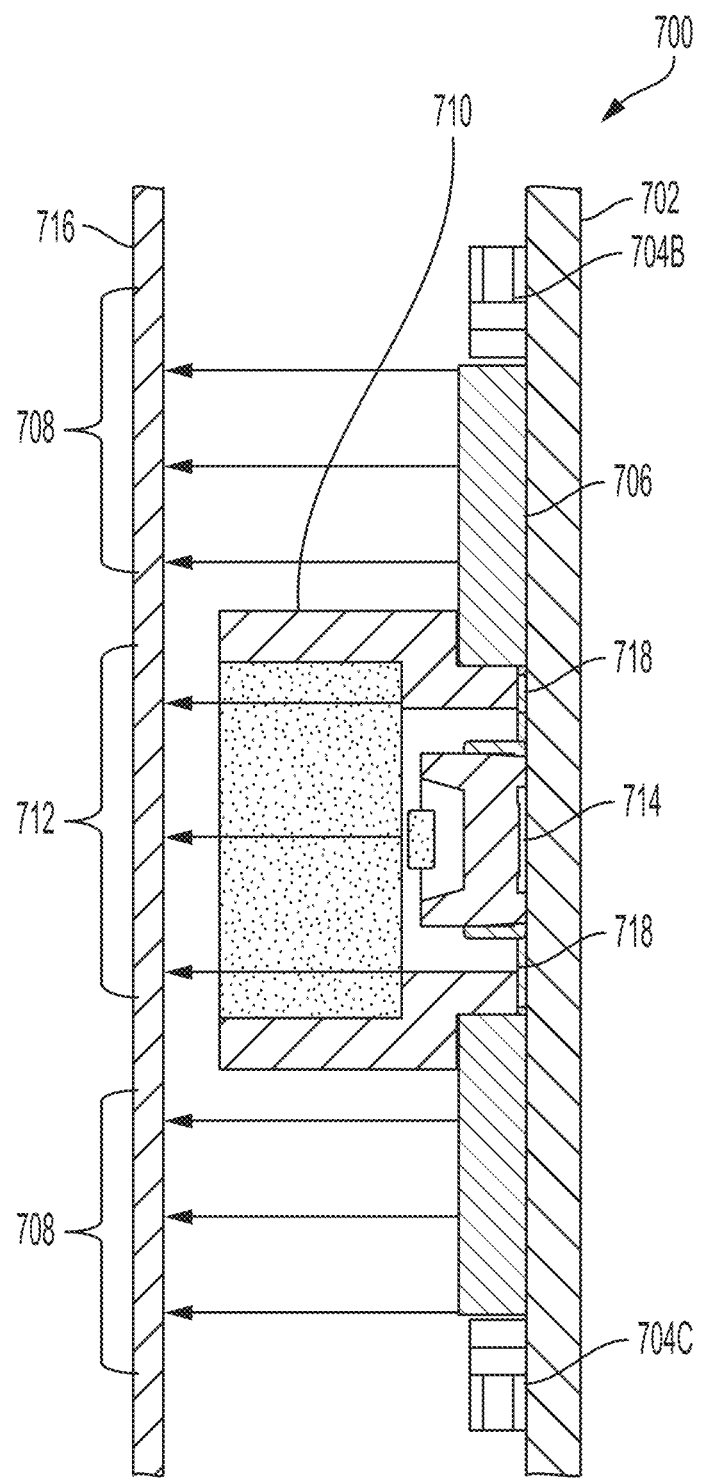
FIG. 7D is a side view of an example illuminable icon and lighting circuit for the illuminable icon with an illuminated outer portion and an illuminated inner portion according to some embodiments of the disclosure.

In a second configuration, shown in FIGS. 7C-D, the plurality of light sources 704A-D may illuminate the first portion 708 of the illuminable icon, while light from the isolated light source 714 may illuminate the second portion 712 of the illuminable icon. Isolation block may prevent light from the plurality of light sources 704A-D for illuminating the first portion 708 of the illuminable icon from illuminating the second portion 712 of the illuminable icon and may also prevent light from the isolated light source 714 from illuminating the first portion 708 of the illuminable icon. The second portion 712 of the illuminable icon may be illuminated to indicate to a user that one or more notifications or messages are available to be viewed on the information handling system and/or that the system has encountered one or more errors. In some embodiments, the isolated light source 714 may illuminate the second portion 712 of the illuminable icon with light of the second color, such as amber.

Figure 8:
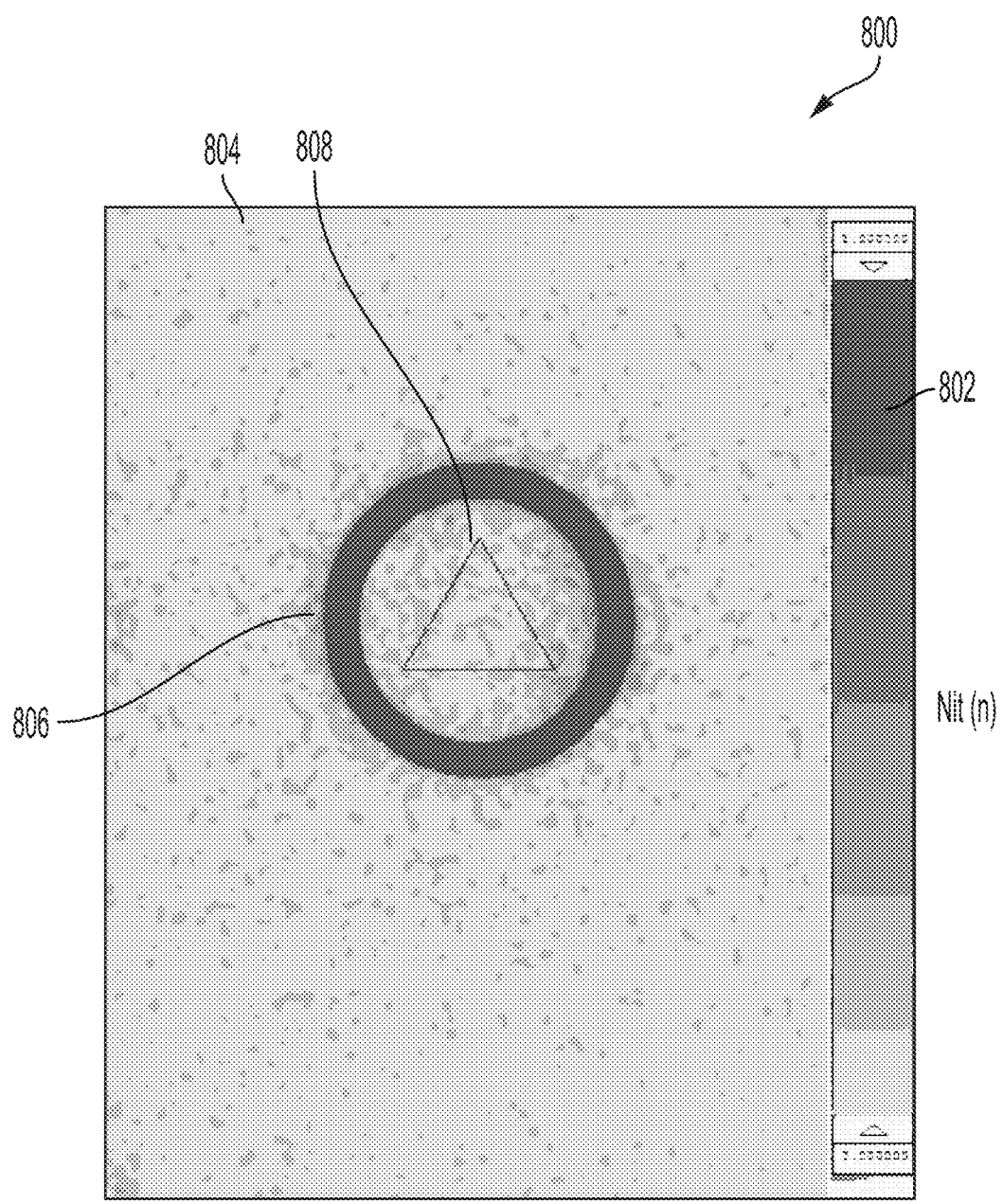
FIG. 8 is a light intensity diagram of an example illuminable icon with an isolation block according to some embodiments of the disclosure.

Using an isolation block to prevent light from light sources for illuminating a first illuminable icon or a first portion of an illuminable icon from illuminating other illuminable icons or portions of the illuminable icon may reduce user confusion and enhance the aesthetic appeal of the icon. FIG. 8 is a light intensity diagram for illumination of a first portion of an illuminable icon. The scale 802 shows light intensity increasing from 0 nits at white to 1 or more nits at red, and extends from 0 nits to 1 nit to show light even at a very low luminance level. The view 804 of a portion of a front panel of an information handing system shows an illuminable icon 806 that is illuminated at a high intensity, at or exceeding 1 nit. The intensity of light present at the rest of the surface of the front panel of the information handling system is very low. For example, light emitted from the second portion 808 of the illuminable icon, within the first portion 806 of the illuminable icon is very low in intensity at less than 0.3 nits.

Figure 9:
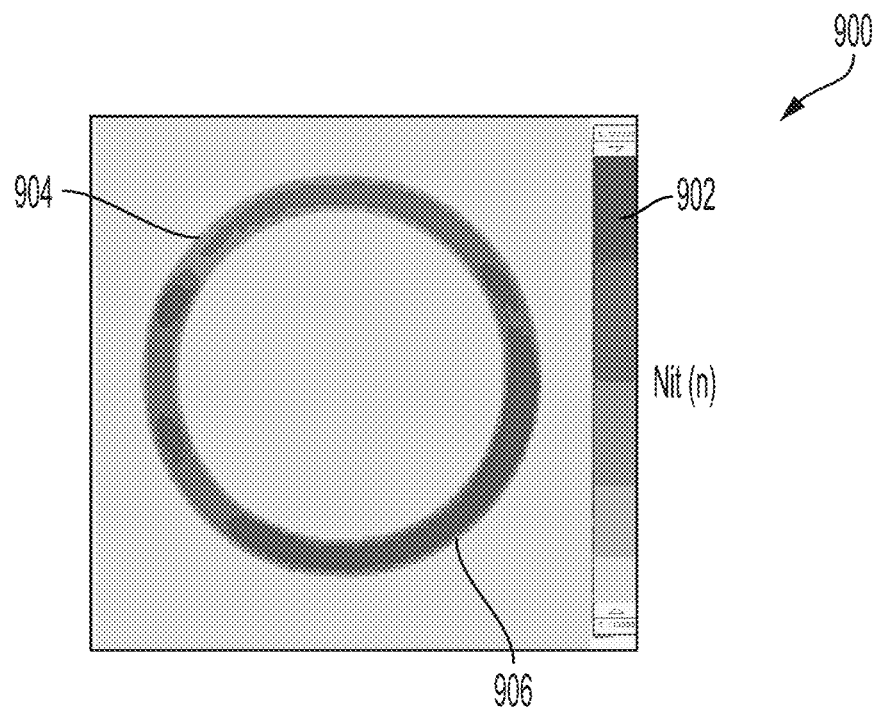
FIG. 9 is a light intensity diagram of an example illuminable icon with a light guide film when lit using one or more amber light sources according to some embodiments of the disclosure.

Using a light guide film to diffuse light from one or more light sources across an illuminable icon or a portion of an illuminable icon may also reduce user confusion and enhance the aesthetic appeal of the icon. FIG. 9 is a light intensity distribution diagram showing the intensity of amber light emanated from an illuminable icon 900 using a light guide film to diffuse light from multiple light sources across the illuminable icon. The scale 902 shows light intensity rising from 0 nits at white to 10 nits at black. As shown in FIG. 9, the lowest light intensity, around area 904 is around 50-60 nits, while the area 906 with the highest light intensity emits light at around 140-150 nits. Thus, the variance in light intensity across the illuminable icon 900 when illuminated with amber light is narrow, with the least illuminated point being within 100 nits of the most illuminated point.

Figure 10:
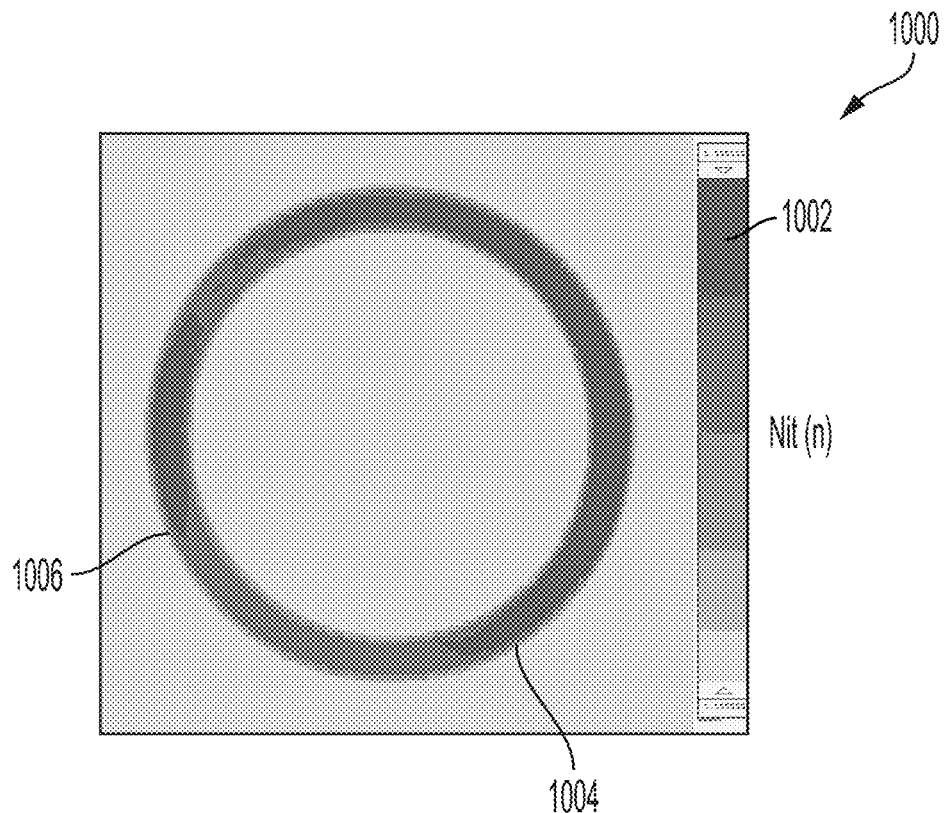
FIG. 10 is a light intensity diagram of an example illuminable icon with a light guide film when lit using one or more blue light sources according to some embodiments of the disclosure.

FIG. 10 is a light intensity distribution diagram showing the intensity of blue light emanated from an illuminable icon 1000 using a light guide film to diffuse light from multiple light sources across the illuminable icon. The scale 1002 shows light intensity rising from 0 nits at white to 100 nits at black. As shown in FIG. 10, the lowest light intensity, around area 1006 is around 60-70 nits, while the area 1004 with the highest light intensity emits light at around 150-160 nits. Thus, the variance in light intensity across the illuminable icon 1000 when illuminated with amber light is narrow, with the least illuminated point being within 100 nits of the most illuminated point.

Figure 11:
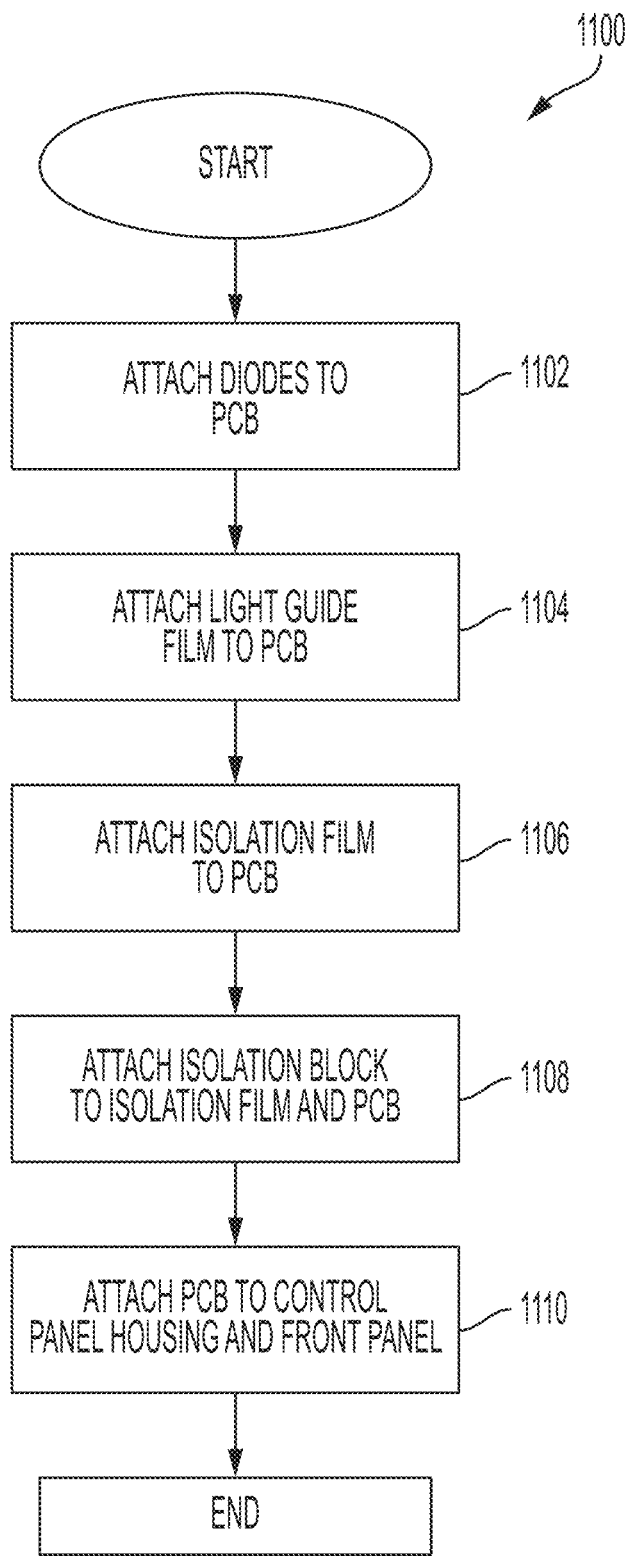
FIG. 11 is a flow chart diagram of an example method of manufacturing a lighting circuit for an illuminable icon according to some embodiments of the disclosure.

A lighting circuit for an illuminable icon may be assembled according to the method 1100 shown in FIG. 11. The method 1100 may begin, at step 1102, with attaching one or more diodes to a PCB. After the diodes are attached to the PCB, a light guide film may be attached to the PCB at step 1104. For example, the light guide film may be cut and shaped to match the form factor and light source arrangement of the lighting circuit. In some embodiments, an aperture may be formed at the center of the light guide film to make room for attachment of an isolation film and isolation block to the PCB. An adhesive may be applied to one side of the light guide film. The side of the light guide film with the adhesive applied may then be pressed against the PCB to attach the light guide film to the PCB. An isolation film may then be attached, at step 1106, to the PCB. For example, the isolation film may be attached around the circumference of the aperture in the light guide film cut for the isolation film and the isolation block. At step 1108, the isolation block may be attached to the isolation film and the light guide film. For example, the isolation block may be attached to the PCB via the isolation film creating a seal between the isolation block and the PCB to prevent light from passing between the isolation block and the PCB. The connection between the isolation block and the PCB may be further enhanced by attaching at least a portion of the isolation block to the light guide film using an adhesive. At step 1110, the assembled PCB containing the lighting circuit may be attached to a control panel housing and, by extension, a front panel of the faceplate containing an illuminable icon. The faceplate may be installed in an information handling system to indicate information about the status of the information handling system.

The flow chart diagram of FIG. 11 is generally set forth as a logical flow diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a plurality of light sources, wherein the plurality of light sources are positioned in direct contact with a first surface;
an illuminable icon positioned in direct contact with a second surface different than the first surface;
an isolation block positioned in direct contact with the first surface; and
a light guide film positioned in direct contact with the first surface and adjacent to the plurality of light sources,
wherein the light guide film is configured to diffuse light from the plurality of light sources across the illuminable icon, and
wherein the light guide film comprises a cutout to allow the isolation block to directly contact the first surface.

2. The apparatus of claim 1,
wherein the illuminable icon comprises:
a first portion; and
a second portion,
and wherein the isolation block is configured to prevent light from the plurality of light sources from illuminating the second portion of the illuminable icon.

3. The apparatus of claim 2, further comprising an isolation film, wherein the isolation film is configured to further prevent light from the plurality of light sources from illuminating the second portion of the illuminable icon.

4. The apparatus of claim 2, further comprising:
an isolated light source;
wherein the isolated light source is configured to illuminate the second portion of the illuminable icon, and
wherein the isolation block is further configured to prevent light from the isolated light source from illuminating the first portion of the illuminable icon.

5. The apparatus of claim 4, wherein the plurality of light sources comprises a plurality of light sources of a first color and a plurality of light sources of a second color, wherein the plurality of light sources of the first color is configured to illuminate the first portion of the illuminable icon to indicate a first condition of an information handling system, and wherein the plurality of light sources of the second color is configured to illuminate the first portion of the illuminable icon to indicate a second condition of the information handling system.

6. The apparatus of claim 5, wherein the isolated light source is an isolated light source of the second color, and wherein the isolated light source is configured to illuminate the second portion of the illuminable icon to indicate a third condition of the information handling system.

7. The apparatus of claim 1, wherein the illuminable icon comprises a portion of a faceplate of an information handling system that is at least partially transparent.

8. The apparatus of claim 1, wherein the plurality of light sources are configured to deliver light in a direction away from the illuminable icon.

9. An apparatus, comprising:
a plurality of light sources, wherein the plurality of light sources are positioned in direct contact with a first surface;
an illuminable icon positioned in direct contact with a second surface different than the first surface, the illuminable icon comprising:
a first portion; and
a second portion;
an isolation block positioned in direct contact with the first surface,
wherein the isolation block is configured to prevent light from the plurality of light sources from illuminating the second portion of the illuminable icon; and
a light guide film positioned in direct contact with the first surface and adjacent to the plurality of light sources,
wherein the light guide film is configured to diffuse light from the plurality of light sources across the illuminable icon, and wherein the light guide film comprises a cutout to allow the isolation block to directly contact the first surface.

10. The apparatus of claim 9, further comprising an isolation film, wherein the isolation film is configured to further prevent light from the plurality of light sources from illuminating the second portion of the illuminable icon.

11. The apparatus of claim 9, further comprising:
an isolated light source;
wherein the isolated light source is configured to illuminate the second portion of the illuminable icon, and
wherein the isolation block is further configured to prevent light from the isolated light source from illuminating the first portion of the illuminable icon.

12. The apparatus of claim 11, wherein the plurality of light sources comprises a plurality of light sources of a first color and a plurality of light sources of a second color, wherein the plurality of light sources of the first color is configured to illuminate the first portion of the illuminable icon to indicate a first condition of an information handling system, and wherein the plurality of light sources of the second color is configured to illuminate the first portion of the illuminable icon to indicate a second condition of the information handling system.

13. The apparatus of claim 12, wherein the isolated light source is an isolated light source of the second color, and wherein the isolated light source is configured to illuminate the second portion of the illuminable icon to indicate a third condition of the information handling system.

14. The apparatus of claim 9, wherein the illuminable icon comprises portion of a faceplate of the information handling system that is at least partially transparent.

15. The apparatus of claim 9, wherein the plurality of light sources are configured to deliver light in a direction away from the illuminable icon.

16. An information handling system, comprising:
an illuminable icon positioned in direct contact with a first surface, the illuminable icon comprising:
a first portion; and
a second portion;
a plurality of light sources positioned in direct contact with a second surface different from the first surface, the plurality of light sources configured to illuminate the first portion of the illuminable icon;
an isolated light source configured to illuminate the second portion of the illuminable icon;
a light guide film positioned in direct contact with the second surface and adjacent to the plurality of light sources, the light guide film configured to diffuse light from the plurality of light sources across the first portion of the illuminable icon; and
an isolation block positioned in direct contact with the first surface and configured to prevent light from the plurality of light sources from illuminating the second portion of the illuminable icon and to prevent light from the isolated light source from illuminating the first portion of the illuminable icon, wherein the light guide film comprises a cutout to allow the isolation block to directly contact the first surface.

17. The information handling system of claim 16, wherein the plurality of light sources comprises a plurality of light sources of a first color and a plurality of light sources of a second color, wherein the isolated light source is a light source of the second color, wherein the plurality of light sources of the first color is configured to illuminate the first portion of the illuminable icon to indicate a first condition of the information handling system, wherein the plurality of light sources of the second color is configured to illuminate the first portion of the illuminable icon to indicate a second condition of the information handling system, and wherein the isolated light source is configured to illuminate the second portion of the illuminable icon to indicate a third condition of the information handling system.

18. The information handling system of claim 16, wherein the plurality of light sources are configured to deliver light in a direction away from the illuminable icon.

\* \* \* \* \*